(12) United States Patent
Mizuguchi et al.

(10) Patent No.: US 11,122,837 B2
(45) Date of Patent: Sep. 21, 2021

(54) POWER SUPPLY UNIT FOR AEROSOL SUCTION DEVICE AND POWER SUPPLY DIAGNOSIS METHOD OF AEROSOL SUCTION DEVICE

(71) Applicant: JAPAN TOBACCO INC., Tokyo (JP)

(72) Inventors: Kazuma Mizuguchi, Tokyo (JP); Manabu Yamada, Tokyo (JP); Ryoji Fujita, Tokyo (JP); Hajime Fujita, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 0 days.

(21) Appl. No.: 16/930,464

(22) Filed: Jul. 16, 2020

(65) Prior Publication Data
US 2021/0015169 A1    Jan. 21, 2021

(30) Foreign Application Priority Data

Jul. 17, 2019   (JP) .............................. JP2019-131693

(51) Int. Cl.
*A24F 40/90* (2020.01)
*A24F 40/53* (2020.01)

(52) U.S. Cl.
CPC .............. *A24F 40/90* (2020.01); *A24F 40/53* (2020.01)

(58) Field of Classification Search
CPC ................................ A24F 40/90; A24F 40/53
USPC ....................................................... 131/329
See application file for complete search history.

(56) References Cited

U.S. PATENT DOCUMENTS

| | | | | |
|---|---|---|---|---|
| 9,408,416 | B2 * | 8/2016 | Monsees | A61M 15/0023 |
| 9,497,999 | B2 * | 11/2016 | Lord | A24F 47/008 |
| 9,974,338 | B2 * | 5/2018 | Alarcon | A24F 40/50 |
| 10,143,241 | B2 * | 12/2018 | Alarcon | G02B 6/0036 |
| 10,159,279 | B2 * | 12/2018 | Lord | H05B 3/0014 |
| 10,244,793 | B2 * | 4/2019 | Monsees | A24F 13/04 |
| 2007/0229294 | A1 | 10/2007 | Vossmeyer et al. | |
| 2010/0102975 | A1 | 4/2010 | Vossmeyer et al. | |
| 2011/0226236 | A1 * | 9/2011 | Buchberger | A24F 47/008 128/200.23 |

(Continued)

FOREIGN PATENT DOCUMENTS

| | | |
|---|---|---|
| CA | 3079163 A1 | 4/2019 |
| CN | 103099319 B | 7/2015 |

(Continued)

OTHER PUBLICATIONS

Notification of Reasons for Refusal received for Japanese Patent Application No. 2019-131693, dated Oct. 15, 2019, 6 pages including English Translation.

(Continued)

*Primary Examiner* — Peter G Leigh
(74) *Attorney, Agent, or Firm* — Xsensus LLP

(57) ABSTRACT

A power supply unit for an aerosol suction device includes: a power supply capable of discharging to a load for generating an aerosol from an aerosol generation source; and a controller capable of controlling charging and discharging of the power supply. The controller is capable of operating in a charging mode for controlling charging of the power supply, a first mode different from the charging mode, and a second mode different from the charging mode and the first mode, and is capable of executing diagnosis processes of the power supply in each of the first mode and the second mode.

12 Claims, 10 Drawing Sheets

(56) References Cited

U.S. PATENT DOCUMENTS

| | | | | |
|---|---|---|---|---|
| 2013/0042865 | A1* | 2/2013 | Monsees | A24F 40/60 |
| | | | | 128/203.27 |
| 2013/0255702 | A1* | 10/2013 | Griffith, Jr. | A24F 47/008 |
| | | | | 131/328 |
| 2013/0312742 | A1* | 11/2013 | Monsees | A61M 15/06 |
| | | | | 128/202.21 |
| 2014/0000638 | A1* | 1/2014 | Sebastian | A24F 40/30 |
| | | | | 131/328 |
| 2014/0150810 | A1 | 6/2014 | Hon | |
| 2014/0343736 | A1* | 11/2014 | Meyer | G05D 7/0635 |
| | | | | 700/283 |
| 2014/0366898 | A1* | 12/2014 | Monsees | A24F 47/008 |
| | | | | 131/329 |
| 2015/0136153 | A1* | 5/2015 | Lord | A24F 47/008 |
| | | | | 131/328 |
| 2016/0262459 | A1* | 9/2016 | Monsees | A61M 15/06 |
| 2016/0321879 | A1 | 11/2016 | Oh et al. | |
| 2016/0331037 | A1* | 11/2016 | Cameron | A24F 47/008 |
| 2016/0334119 | A1* | 11/2016 | Cameron | F24F 3/16 |
| 2016/0338412 | A1* | 11/2016 | Monsees | F21V 33/0004 |
| 2016/0345631 | A1* | 12/2016 | Monsees | G05D 23/1917 |
| 2016/0374400 | A1* | 12/2016 | Monsees | A24F 40/53 |
| | | | | 131/329 |
| 2017/0027234 | A1 | 2/2017 | Farine et al. | |
| 2017/0245547 | A1* | 8/2017 | Lipowicz | A24F 40/50 |
| 2018/0020727 | A1 | 1/2018 | Hoffman et al. | |
| 2018/0043114 | A1* | 2/2018 | Bowen | A61M 15/003 |
| 2019/0337475 | A1 | 11/2019 | Kawamura | |
| 2020/0237015 | A1 | 7/2020 | Yamada et al. | |
| 2020/0245688 | A1 | 8/2020 | Yamada et al. | |

FOREIGN PATENT DOCUMENTS

| | | | | |
|---|---|---|---|---|
| CN | 104770884 | B | 7/2017 | |
| CN | 107432498 | A | 12/2017 | |
| JP | 10-012284 | A | 1/1998 | |
| JP | 2002-117911 | A | 4/2002 | |
| JP | 2013-085386 | A | 5/2013 | |
| JP | 2016-536023 | A | 11/2016 | |
| JP | 2017-514463 | A | 6/2017 | |
| JP | 2019-511909 | A | 5/2019 | |
| JP | WO2019082249 | * | 5/2019 | A24F 40/50 |
| KR | 10-2007-0098691 | A | 10/2007 | |
| KR | 10-2017-0067171 | A | 6/2017 | |
| WO | 2015/035510 | A1 | 3/2015 | |
| WO | 2018/142734 | A1 | 8/2018 | |
| WO | 2019/064364 | A1 | 4/2019 | |
| WO | 2019/077710 | A1 | 4/2019 | |
| WO | 2019/077711 | A1 | 4/2019 | |
| WO | 2019/082249 | A1 | 5/2019 | |

OTHER PUBLICATIONS

Decision to Grant a Patent received for Japanese Patent Application No. 2019-131693, dated Mar. 3, 2020, 5 pages including English Translation.

Office Action dated Oct. 8, 2020 in Korean Patent Application No. 10-2020-0087270, 32 pages.

European search report dated Dec. 21, 2020, in corresponding European patent Application No. 20186453.5, 4 pages.

European Communication pursuant to Article 94(3) dated Jan. 19, 2021, in corresponding European Patent Application No. 20 186 453.5.

* cited by examiner

POWER SUPPLY UNIT FOR AEROSOL SUCTION DEVICE AND POWER SUPPLY DIAGNOSIS METHOD OF AEROSOL SUCTION DEVICE

CROSS-REFERENCE TO RELATED APPLICATIONS

This application is based on and claims priority under 35 USC 119 from Japanese Patent Application No. 2019-131693 filed on Jul. 17, 2019, the contents of which are incorporated herein by reference.

TECHNICAL FIELD

The present disclosure relates to a power supply unit for an aerosol suction device, a power supply diagnosis method of the aerosol suction device, and a power supply diagnosis program of the aerosol suction device.

BACKGROUND ART

An aerosol suction device is known which includes an aerosol generation source, a load for generating an aerosol from the aerosol generation source, a power supply that can discharge to the load, and a controller that controls the power supply. For example, see Japanese Translation of PCT International Application Publication No. JP-T-2016-536023 (hereinafter, referred to as Patent Literature 1), Description of Chinese Patent Publication No. 103099319 (hereinafter, referred to as Patent Literature 2), Description of Chinese Patent Publication No. 107432498 (hereinafter, referred to as Patent Literature 3), and Japanese Translation of PCT International Application Publication No. JP-T-2017-514463 (hereinafter, referred to as Patent Literature 4).

An apparatus described in Patent Literature 1 includes a bulkhead for preventing a substance that leaks from the battery from entering an atomizer region. An apparatus described in Patent Literature 4 has a function of diagnosing a state of the battery.

Since the aerosol suction device is used by a user holding the aerosol suction device in a mouth, safety of the power supply is strongly required. Therefore, it is preferable that an extent of deterioration of the power supply and an abnormality of the power supply can be diagnosed.

Although Patent Literatures 1 to 3 disclose a method for preventing an influence on other components when an electrolytic solution of the battery leaks, deterioration and an abnormality of the battery are not detected. Although Patent Literature 4 discloses a method for diagnosing a state of the battery, safety is insufficient only by this method.

An object of the present disclosure is to provide a power supply unit for an aerosol suction device, a power supply diagnosis method of the aerosol suction device, and a power supply diagnosis program of the aerosol suction device that can diagnose a power supply with high accuracy so as to improve safety.

SUMMARY

A power supply unit for an aerosol suction device of the present disclosure includes: a power supply capable of discharging to a load for generating an aerosol from an aerosol generation source; and a controller capable of controlling charging and discharging of the power supply. The controller is capable of operating in a charging mode for controlling charging of the power supply, a first mode different from the charging mode, and a second mode different from the charging mode and the first mode, and is capable of executing diagnosis processes of the power supply in each of the first mode and the second mode.

According to the present disclosure, the power supply can be diagnosed with high accuracy so as to improve safety of the device.

DESCRIPTION OF EMBODIMENTS

Hereinafter, a power supply unit for an aerosol suction device according to an embodiment of the present disclosure will be described.

Figure 1:
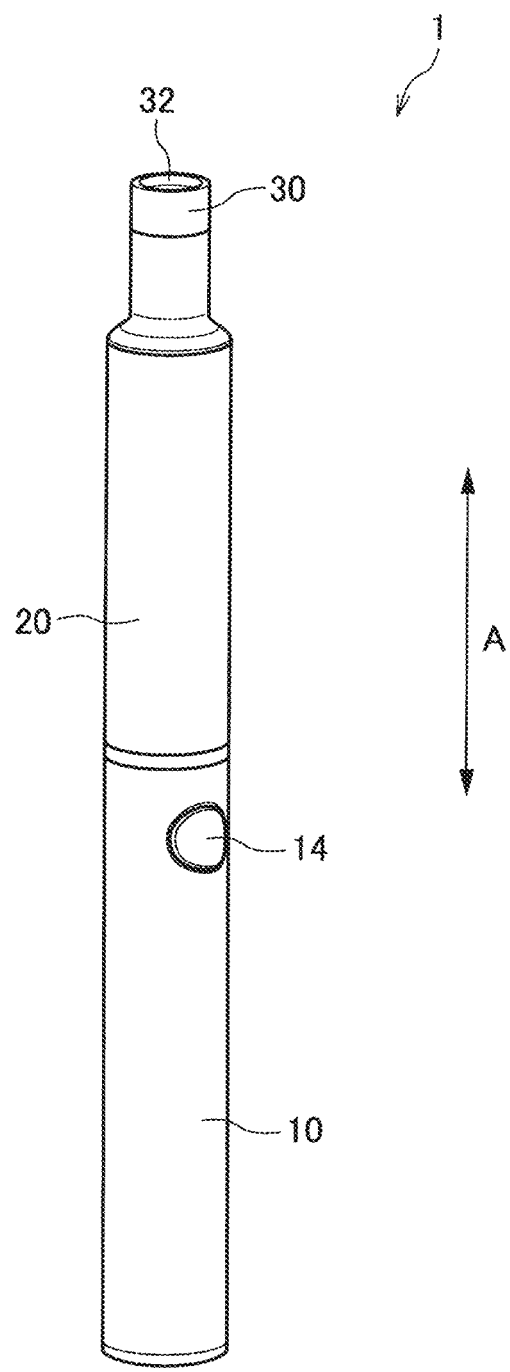
FIG. 1 is a perspective view of an aerosol suction device on which a power supply unit according to an embodiment of the present disclosure is mounted.
Figure 2:
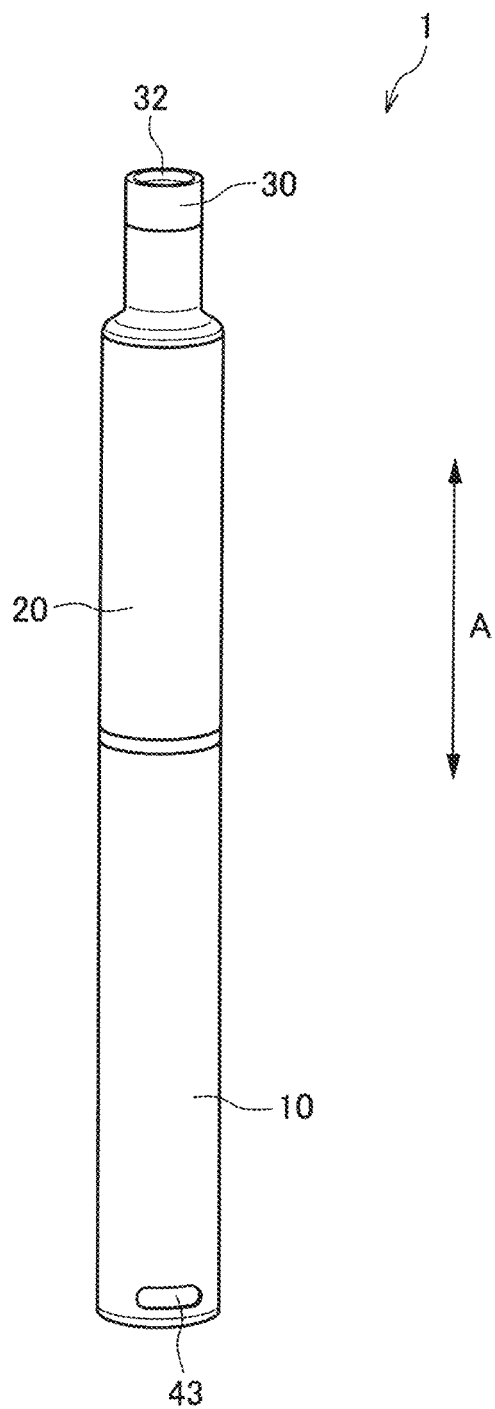
FIG. 2 is another perspective view of the aerosol suction device of FIG. 1.

First, the aerosol suction device on which the power supply unit is mounted will be described with reference to FIGS. 1 and 2.

(Aerosol Suction Device)

An aerosol suction device 1 is a device for suctioning an aerosol to which a flavor is added without combustion, and has a rod shape that extends along a predetermined direction (hereinafter, referred to as a longitudinal direction A).

The aerosol suction device 1 is provided with a power supply unit 10, a first cartridge 20, and a second cartridge 30 in this order along the longitudinal direction A. The first cartridge 20 is attachable to and detachable from the power supply unit 10. The second cartridge 30 is attachable to and detachable from the first cartridge 20. In other words, the first cartridge 20 and the second cartridge 30 are replaceable.

(Power Supply Unit)

As shown in FIGS. 3, 4, 5, and 6, the power supply unit 10 of the present embodiment houses a power supply 12, a charging IC 55, a Micro Controller Unit (MCU) 50, a switch 19, an electrostatic capacitance sensor 13, a voltage sensor 16, various sensors, and the like inside a cylindrical power supply unit case 11. The power supply 12 is a rechargeable secondary battery, an electric double-layer capacitor, or the like, and is preferably a lithium-ion battery. At least a part of an electrolyte of the power supply 12 is configured with an electrolytic solution. Hereinafter, the power supply 12 is described as the lithium-ion battery. The electrostatic capacitance sensor 13 is provided to detect leakage of the electrolytic solution from the power supply 12 housed in the power supply unit case 11 and entering of a liquid such as water from outside into the power supply unit case 11.

A discharging terminal 41 is provided on a top portion 11a positioned on one end side (first cartridge 20 side) of the power supply unit case 11 in the longitudinal direction A. The discharging terminal 41 protrudes from an upper surface of the top portion 11a toward the first cartridge 20 and can be electrically connected to a load 21 of the first cartridge 20.

An air supply unit 42 that supplies air to the load 21 of the first cartridge 20 is provided in the vicinity of the discharging terminal 41 on the upper surface of the top portion 11a.

A charging terminal 43 that can be electrically connected to an external power supply 60 (see FIG. 6) that can charge the power supply 12 is provided inside a bottom portion 11b positioned on the other end side (side opposite to the first cartridge 20) of the power supply unit case 11 in the longitudinal direction A. The charging terminal 43 is provided in a side surface of the bottom portion 11b, and for example, at least one of a USB terminal, a microUSB terminal, and a Lightning (registered trademark) terminal can be connected to the charging terminal 43.

The charging terminal 43 may be a power receiving unit that can receive, in a wireless manner, power supplied from the external power supply 60. In such a case, the charging terminal 43 (power receiving unit) may be configured with a power receiving coil. A method for the wireless power transfer may be electromagnetic induction or magnetic resonance. Further, the charging terminal 43 may be a power receiving unit that can receive, without contact, the power supplied from the external power supply 60. As another example, at least one of the USB terminal, the microUSB terminal, and the Lightning terminal can be connected to the charging terminal 43, and the charging terminal 43 may include the above-described power receiving unit.

The power supply unit case 11 is provided with an operation unit 14, which can be operated by a user, on the side surface of the top portion 11a so as to face a side opposite to the charging terminal 43. More specifically, the operation unit 14 and the charging terminal 43 are in a point-symmetrical relationship with an intersection of a straight line that connects the operation unit 14 to the charging terminal 43 and a center line of the power supply unit 10 in the longitudinal direction A. The operation unit 14 is configured with a button type switch, a touch panel, and the like. An intake sensor 15 that detects a puff operation is provided in the vicinity of the operation unit 14.

The charging IC 55 is disposed close to the charging terminal 43 and controls, under control of the MCU 50, charging of the power supply 12 with a power input from the charging terminal 43. The charging IC 55 includes a converter that converts a direct current from an inverter 61 or the like (see FIG. 6) to a direct current having different magnitude, a voltmeter, an ammeter, a processor, and the like. The inverter 61 or the like is mounted on a charging cable connected to the charging terminal 43 and converts an alternating current into a direct current.

Figure 5:
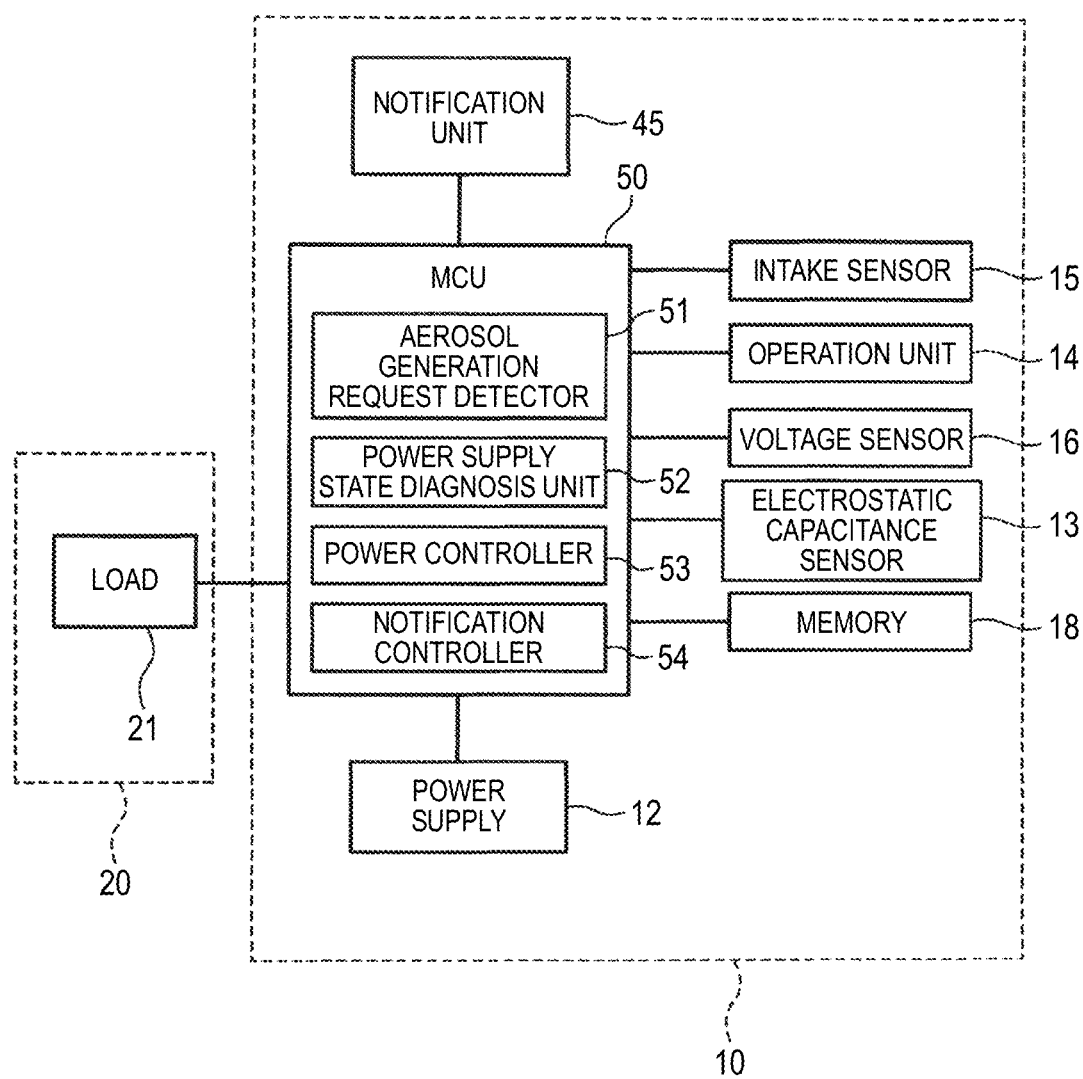
FIG. 5 is a block diagram showing a configuration of main parts of the power supply unit in the aerosol suction device of FIG. 1.

As shown in FIG. 5, the MCU 50 is connected to various sensor devices such as the electrostatic capacitance sensor 13, the intake sensor 15 that detects a puff (intake) operation, and a voltage sensor 16 that measures a power supply voltage of the power supply 12, the operation unit 14, a notification unit 45 to be described later, and a memory 18 that stores the number of times of puff operations, an energization time of the load 21, or the like, and performs various control of the aerosol suction device 1. Specifically, the MCU 50 is mainly configured with a processor, and further includes a storage medium such as a random access memory (RAM) necessary for an operation of the processor and a read only memory (ROM) that stores various pieces of information. The processor in the present description is, more specifically, an electric circuit in which circuit elements such as semiconductor elements are combined.

The power supply unit case 11 is provided with an air intake port (not shown) for taking outside air into the power supply unit case 11. The air intake port may be provided around the operation unit 14 or may be provided around the charging terminal 43.

(First Cartridge)

Figure 3:
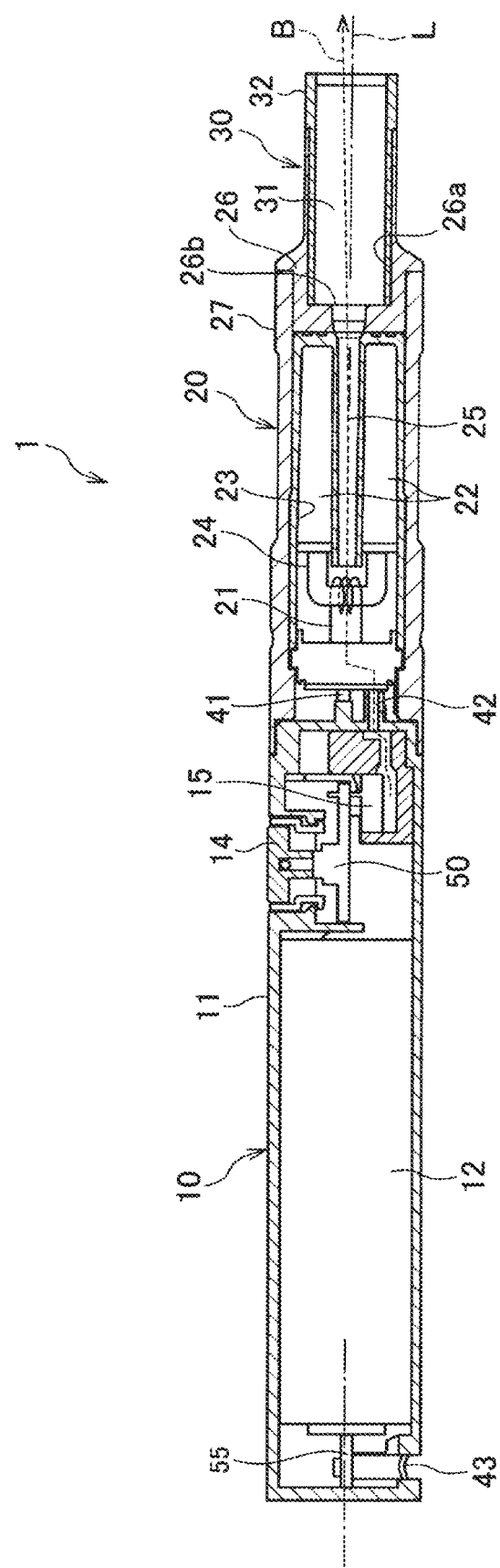
FIG. 3 is a cross-sectional view of the aerosol suction device of FIG. 1.
Figure 4:
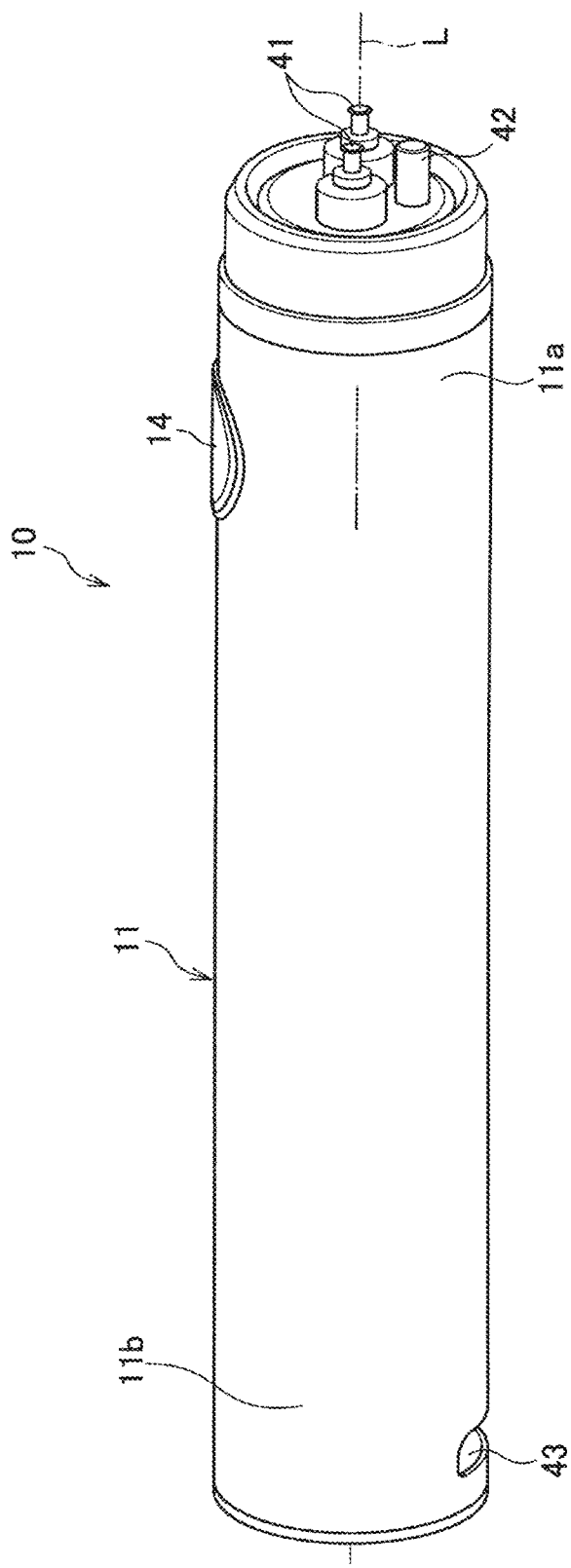
FIG. 4 is a perspective view of the power supply unit in the aerosol suction device of FIG. 1.

As shown in FIG. 3, the first cartridge 20 includes, inside a cylindrical cartridge case 27, a reservoir 23 that stores an aerosol source 22, the electric load 21 that atomizes the aerosol source 22, a wick 24 that draws the aerosol source from the reservoir 23 into the load 21, an aerosol flow path 25 that causes the aerosol generated by the atomization of the aerosol source 22 to flow toward the second cartridge 30, and an end cap 26 that houses a part of the second cartridge 30.

The reservoir 23 is partitioned and formed so as to surround a periphery of the aerosol flow path 25 and stores the aerosol source 22. A porous body such as a resin web or cotton may be housed in the reservoir 23, and the porous body may be impregnated with the aerosol source 22. In the reservoir 23, the porous body on the resin web or the cotton may not be housed and only the aerosol source 22 may be stored. The aerosol source 22 contains a liquid such as glycerin, propylene glycol, or water.

The wick 24 is a liquid holding member that draws the aerosol source 22 from the reservoir 23 into the load 21 by using a capillary phenomenon, and is configured with, for example, glass fiber or porous ceramic.

The load 21 atomizes the aerosol source 22 without combustion by power supplied from the power supply 12 via the discharging terminal 41. The load 21 is configured with an electric heating wire (coil) wound at a predetermined pitch. The load 21 may be an element that can atomize the aerosol source 22 so as to generate an aerosol, and is, for example, a heating element or an ultrasonic generator. Examples of the heating element include a heating resistor, a ceramic heater, and an induction heating heater.

The aerosol flow path 25 is downstream of the load 21 and provided on the center line L of the power supply unit 10.

The end cap 26 includes a cartridge housing portion 26a that houses a part of the second cartridge 30, and a communication path 26b that communicates the aerosol flow path 25 with the cartridge housing portion 26a.

(Second Cartridge)

The second cartridge 30 stores a flavor source 31. The second cartridge 30 is detachably housed in the cartridge housing portion 26a provided in the end cap 26 of the first cartridge 20. The second cartridge 30 includes a suction port 32 of a user at an end portion on a side opposite to a first cartridge 20 side. The suction port 32 is not limited to the case of being integrally formed with the second cartridge 30 and may be configured to be attachable to and detachable from the second cartridge 30. Accordingly, the suction port 32 is separate from the power supply unit 10 and the first cartridge 20, so that the suction port 32 can be kept hygienic.

The second cartridge 30 causes the aerosol generated by the load 21 atomizing the aerosol source 22 to pass through the flavor source 31, so that a flavor is given to the aerosol. As raw material pieces that constitute the flavor source 31, shredded tobacco or a molded body obtained by molding a tobacco raw material into a granular shape can be used. The flavor source 31 may be configured with a plant other than the tobacco (for example, mint, Chinese herbs, herbs, or the like). A flavor material such as menthol may be given to the flavor source 31.

In the aerosol suction device 1 of the present embodiment, the aerosol source 22, the flavor source 31, and the load 21 can generate an aerosol to which a flavor is added. That is, the aerosol source 22 and the flavor source 31 constitute an aerosol generation source that generates the aerosol.

The aerosol generation source of the aerosol suction device 1 is a portion replaced and used by the user. As for this portion, for example, one first cartridge 20 and one or a plurality of (for example, five) second cartridges 30 are provided as one set to the user.

In addition to the configuration in which the aerosol source 22 and the flavor source 31 are separated from each other, the configuration of the aerosol generation source used in the aerosol suction device 1 may be a configuration in which the aerosol source 22 and the flavor source 31 are integrally formed, a configuration in which the flavor source 31 is omitted and a substance that can be contained in the flavor source 31 is added to the aerosol source 22, a configuration in which a medication or the like is added to the aerosol source 22 instead of using the flavor source 31, or the like.

In a case of the aerosol suction device 1 including the aerosol generation source in which the aerosol source 22 and the flavor source 31 are integrally formed, for example, one or a plurality of (for example, 20) aerosol generation sources are provided as one set to the user.

In a case of the aerosol suction device 1 including only the aerosol source 22 as the aerosol generation source, for example, one or a plurality of (for example, 20) aerosol generation sources are provided as one set to the user.

In the aerosol suction device 1 configured as described above, as indicated by an arrow B in FIG. 3, air that flows in from the intake port (not shown) provided in the power supply unit case 11 passes through a vicinity of the load 21 of the first cartridge 20 from the air supply unit 42. The load 21 atomizes the aerosol source 22 drawn from the reservoir 23 by the wick 24. An aerosol generated by the atomization flows through the aerosol flow path 25 together with air that flows in from the intake port, and is supplied to the second cartridge 30 via the communication path 26b. The aerosol supplied to the second cartridge 30 is given a flavor by passing through the flavor source 31 and is supplied to the suction port 32.

The aerosol suction device 1 is provided with a notification unit 45 that notifies various pieces of information (see FIG. 5). The notification unit 45 may be configured with a light-emitting element, may be configured with a vibration element, or may be configured with a sound output element. The notification unit 45 may be a combination of two or more elements among the light-emitting element, the vibration element, and the sound output element. The notification unit 45 may be provided in any of the power supply unit 10, the first cartridge 20, and the second cartridge 30, and is preferably provided in the power supply unit 10. For example, a periphery of the operation unit 14 is translucent. The notification unit 45 emits light by a light-emitting element such as an LED.

(Electric Circuit)

Details of an electric circuit of the power supply unit 10 will be described with reference to FIG. 6.

The power supply unit 10 includes the power supply 12, the electrostatic capacitance sensor 13, the voltage sensor 16 that measures a power supply voltage $V_{Batt}$ that is a voltage of the power supply 12, a positive electrode side discharging terminal 41a and a negative electrode side discharging terminal 41b that constitute the discharging terminal 41, a positive electrode side charging terminal 43a and a negative electrode side charging terminal 43b that constitute the charging terminal 43, the MCU 50 connected between a positive electrode side of the power supply 12 and the positive electrode side discharging terminal 41a and between a negative electrode side of the power supply 12 and the negative electrode side discharging terminal 41b, the charging IC 55 disposed on a power transmission path between the charging terminal 43 and the power supply 12, and the switch 19 disposed on a power transmission path between the power supply 12 and the discharging terminal 41.

The switch 19 is configured with, for example, a semiconductor element such as MOSFET, and opening and closing of the switch 19 is controlled by the MCU 50.

The power supply voltage $V_{Batt}$ measured by the voltage sensor 16 in a state where the charging IC 55 is not connected to the inverter 61 includes a closed circuit voltage (CCV) that is a voltage of the power supply 12 in a state where the load 21 is connected to the discharging terminal 41 and the switch 19 is closed, and an open circuit voltage (OCV) that is a voltage of the power supply 12 in a state where the switch 19 is opened. The power supply voltage $V_{Batt}$ measured by the voltage sensor 16 is transmitted to the MCU 50.

Figure 6:
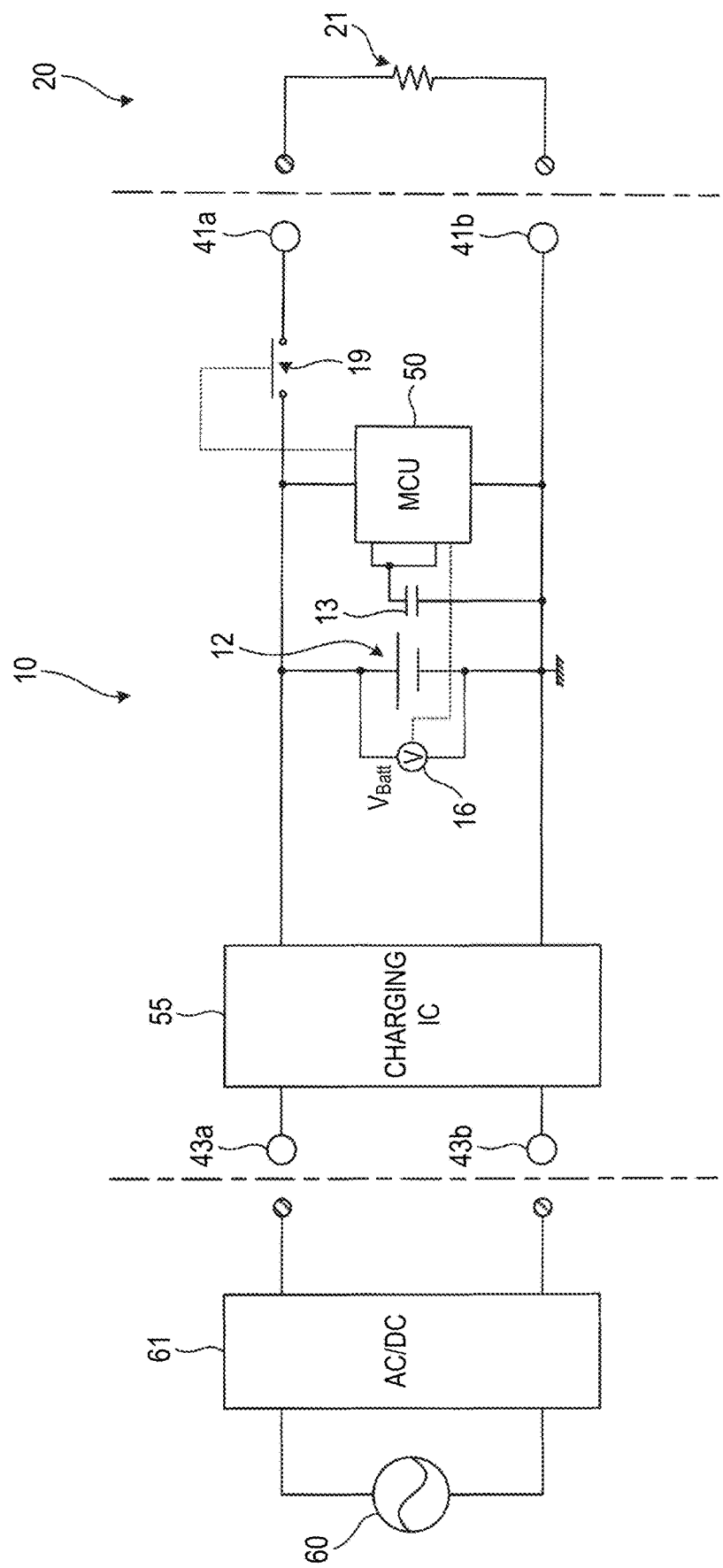
FIG. 6 is a schematic diagram showing a circuit configuration of the power supply unit in the aerosol suction device of FIG. 1.

In the electric circuit of the power supply unit 10 shown in FIG. 6, the switch 19 is provided between the positive electrode side of the power supply 12 and the positive electrode side discharging terminal 41a. Instead of such a so-called positive control, the switch 19 may be a negative control provided between the negative electrode side discharging terminal 41b and the negative electrode side of the power supply 12.

Specifically, the electrostatic capacitance sensor 13 is configured with a capacitor. The electrostatic capacitance sensor 13 is charged or discharged by the MCU 50. When an electrolytic solution of the power supply 12 or a liquid that enters from outside is present between an electrode connected to the MCU 50 and a counter electrode of the electrode of the electrostatic capacitance sensor 13, an electrostatic capacitance of the electrostatic capacitance sensor 13 is changed. The MCU 50 determines, based on a change in a charging time or a discharging time due to the change in the electrostatic capacitance, at least one of whether the electrolytic solution of the power supply 12 leaks inside the power supply unit case 11 and whether a liquid enters from the outside into the power supply unit case 11.

The electrostatic capacitance sensor 13 is disposed, for example, in the power supply unit case 11 at a location where water easily enters from the outside (for example, in the vicinity of the charging terminal 43). Further, the electrostatic capacitance sensor 13 is disposed, for example, in the power supply unit case 11 at a location where an electrolytic solution leaked from the power supply 12 easily reaches (for example, in the vicinity of a positive electrode tab or a negative electrode tab of the power supply 12, between a cover of the power supply 12 and the power supply unit case 11, and the like). The electrostatic capacitance sensors 13 may be arranged at a plurality of locations described above, respectively. Presence of the electrostatic capacitance sensor 13 at such a location makes it possible to detect the electrolytic solution leaked from the power supply 12 and the water that enters from the outside.

(MCU)

Next, the configuration of the MCU 50 will be described more specifically.

As shown in FIG. 5, the MCU 50 includes an aerosol generation request detector 51, a power supply state diagnosis unit 52, a power controller 53, and a notification controller 54 as functional blocks implemented by a processor executing a program stored in ROM.

The aerosol generation request detector 51 detects an aerosol generation request based on an output result of the intake sensor 15. The intake sensor 15 outputs a value of a pressure (internal pressure) change in the power supply unit 10 caused by suction of the user through the suction port 32. The intake sensor 15 is, for example, a pressure sensor that outputs an output value (for example, a voltage value or a current value) corresponding to an internal pressure that changes in accordance with a flow rate of air suctioned from the intake port (not shown) toward the suction port 32 (that is, a puff operation of the user). The intake sensor 15 may be configured with a capacitor microphone or the like.

The power supply state diagnosis unit 52 diagnoses a state of the power supply 12. Specifically, the power supply state diagnosis unit 52 uses information such as the power supply voltage ($V_{Batt}$) measured by the voltage sensor 16 to diagnose whether the power supply 12 is in a deterioration state where deterioration has progressed to a predetermined state, or to diagnose whether the power supply 12 is in a failure state. Examples of the state where the power supply 12 in the present description has deteriorated to the predetermined state include, for example, a state where a state of health (SOH), which is a numerical index indicating a sound state of the power supply 12, is 50% or less. The SOH may be derived from a value obtained by dividing a current full charge capacity of the power supply 12 by a new full charge capacity of the power supply 12. The power supply state diagnosis unit 52 executes a plurality of types of diagnosis processes so as to multifacetedly diagnose the state of the power supply 12. Details of the diagnosis processes will be described later. The power supply state diagnosis unit 52 may diagnose the state of the power supply 12 other than the deterioration state and the failure state.

The notification controller 54 controls the notification unit 45 so as to notify various pieces of information. For example, the notification controller 54 controls the notification unit 45 so as to notify a replacement timing of the second cartridge 30 in response to detection of the replacement timing of the second cartridge 30. The notification controller 54 detects and notifies the replacement timing of the second cartridge 30 based on the accumulated number of times of the puff operations or an accumulated energization time of the load 21 stored in the memory 18. The notification controller 54 may notify a replacement timing of the first cartridge 20, a replacement timing of the power supply 12, a charging timing of the power supply 12, and the like, without being limited to the notification of the replacement timing of the second cartridge 30. The notification controller 54 may notify the state of the power supply 12 diagnosed by the power supply state diagnosis unit 52.

When the puff operation is performed a predetermined number of times in a state where one unused second cartridge 30 is set, or when an accumulated energization time of the load 21 based on the puff operation reaches a predetermined value (for example, 120 seconds), the notification controller 54 determines that the second cartridge 30 has been used (that is, a remaining amount is zero or empty) and notifies the replacement timing of the second cartridge 30.

When it is determined that all the second cartridges 30 included in the above one set have been used, the notification controller 54 may determine that one first cartridge 20 included in the one set has been used (that is, a remaining amount is zero or empty) and notify the replacement timing of the first cartridge 20.

The power controller 53 controls discharge of the power supply 12 via the discharging terminal 41 by turning ON/OFF the switch 19 when the aerosol generation request detector 51 detects an aerosol generation request.

The power controller 53 performs control such that an amount of the aerosol generated by the load 21 atomizing the aerosol source falls within a desired range, in other words, power or an amount of the power supplied from the power supply 12 to the load 21 falls within a certain range. Specifically, the power controller 53 controls ON/OFF of the switch 19 by, for example, pulse width modulation (PWM) control. Instead, the power controller 53 may control the ON/OFF of the switch 19 by pulse frequency modulation (PFM) control.

The power controller 53 stops a power supply from the power supply 12 to the load 21 when a predetermined period has elapsed since the power supply to the load 21 is started in order to generate the aerosol. In other words, the power controller 53 stops the power supply from the power supply 12 to the load 21 when the puff period exceeds a predetermined period even within the puff period during which the user actually performs the puff operation. The predetermined period is determined in order to prevent a variation in the puff period of the user.

Under control of the power controller 53, a current that flows to the load 21 during a single puff operation has a substantially constant value determined by a substantially constant effective voltage supplied to the load 21 by the PWM control and resistance values of the discharging terminal 41 and the load 21. In the aerosol suction device 1 of the present embodiment, when the user uses one unused second cartridge 30 to suction the aerosol, the accumulated energization time of the load 21 is controlled to be, for example, 120 seconds at maximum.

(Operation Modes of MCU)

Figure 7:
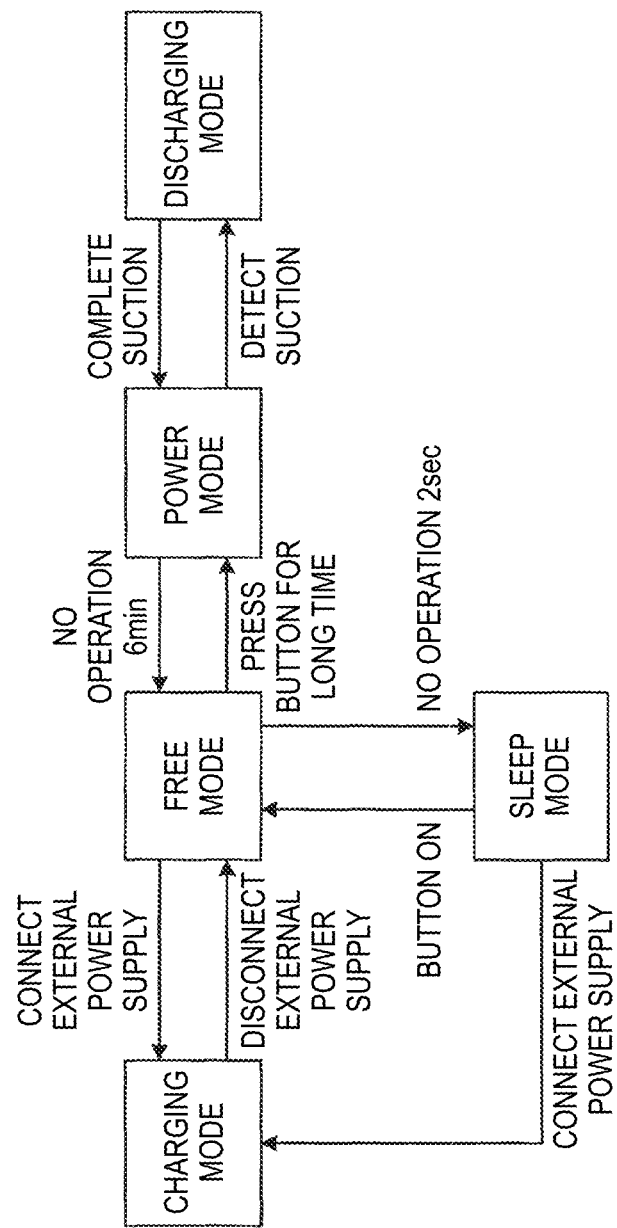
FIG. 7 is a schematic diagram for illustrating operation modes of an MCU 50.

FIG. 7 is a schematic diagram for illustrating operation modes of the MCU 50. As shown in FIG. 7, the MCU 50 is operable in five modes including a charging mode, a sleep mode, a free mode, a power mode, and a discharging mode.

The sleep mode is a mode in which a function for detecting an operation of the operation unit 14 and, if necessary, only a part of a diagnosis process of the power supply 12 are enabled, and is a mode in which power consumption is the lowest among the five modes. When detecting the operation of the operation unit 14 (for example, pressing a button) in the sleep mode, the MCU 50 shifts to the free mode.

The free mode is a mode in which functions other than charging of the power supply 12, discharging from the power supply 12 to the load 21, and detection of a puff operation by the intake sensor 15 are enabled, and is a mode in which power consumption is higher than that in the sleep mode. When a state where the operation of the operation unit 14 is not performed for a predetermined time (for example, 2 seconds) is continued in the free mode, the MCU 50 shifts to the sleep mode. When an operation for shifting to the power mode (for example, pressing a button of the operation unit 14 for a long time) is performed in the free mode, the MCU 50 shifts to the power mode.

The power mode is a mode in which the function of detecting the puff operation by the intake sensor 15 is enabled in addition to the functions enabled in the free mode, and is a mode in which power consumption is higher than that in the free mode. When a state where the operation of the operation unit 14 is not performed is continued for a predetermined time (for example, 6 minutes) in the power mode, the MCU 50 shifts to the free mode. When detecting the puff operation of the user in the power mode, the MCU 50 shifts to the discharging mode.

The discharging mode is a mode in which a function of controlling the switch 19 to perform discharging to the load 21 so as to generate the aerosol is enabled in addition to the functions enabled in the power mode, and is a mode in which power consumption is higher than that in the power mode. In the discharging mode, the MCU 50 shifts to the power mode when completion of the puff operation is detected by the intake sensor 15 or the above-described predetermined period has elapsed after the puff operation is detected.

The charging mode is a mode in which a charging function of the power supply 12 is enabled. Even when the MCU 50 operates in any of the above-described modes, when the charging terminal 43 is connected to the external power supply 60, the MCU 50 shifts to the charging mode. The MCU 50 shifts to the free mode when the charging terminal 43 and the external power supply 60 are disconnected.

(Diagnosis Processes of Power Supply)

The power supply state diagnosis unit 52 can execute the diagnosis processes of the power supply 12 in each of the free mode, the power mode, the discharging mode, and the charging mode among the five modes shown in FIG. 7. The power supply state diagnosis unit 52 can execute eight types of diagnosis processes including a first diagnosis process, a second diagnosis process, a third diagnosis process, a fourth diagnosis process, a fifth diagnosis process, a sixth diagnosis process, a seventh diagnosis process, and an eighth diagnosis process. The first diagnosis process is a process that does not require discharging of the power supply 12 during execution. The sixth diagnosis process, the seventh diagnosis process, and the eighth diagnosis process are processes that require the discharging of the power supply 12 during execution.

The power supply state diagnosis unit 52 executes the first diagnosis process in the free mode. The power supply state diagnosis unit 52 executes the first diagnosis process in the power mode. In the charging mode, the power supply state diagnosis unit 52 executes the second diagnosis process, the third diagnosis process, the fourth diagnosis process, and the fifth diagnosis process in addition to the first diagnosis process. In the discharging mode, the power supply state diagnosis unit 52 executes the sixth diagnosis process, the seventh diagnosis process, and the eighth diagnosis process in addition to the first diagnosis process.

Hereinafter, the diagnosis processes will be described.

(First Diagnosis Process)

The first diagnosis process is a process of diagnosing whether the power supply 12 is in the failure state based on a change in the electrostatic capacitance of the electrostatic capacitance sensor 13. The power supply state diagnosis unit 52 determines, based on the change in the electrostatic capacitance of the electrostatic capacitance sensor 13, whether any one of or both of leakage of a liquid such as the electrolytic solution inside the power supply unit case 11 and entering of a liquid from the outside into the power supply unit case 11 occur(s). Then, when it is determined that the leakage of the liquid or the entering of the liquid occurs, the power supply 12 is diagnosed as being in the failure state.

Specifically, the power supply state diagnosis unit 52 starts charging after the electrostatic capacitance sensor 13 is completely discharged, and measures a time required for performing charging to a full amount. When the time is longer than a threshold, since the electrostatic capacitance of the electrostatic capacitance sensor 13 becomes large, the power supply state diagnosis unit 52 determines that any one of the leakage of the liquid and the entering of the liquid occurs. When the time is equal to or smaller than the threshold, the power supply state diagnosis unit 52 determines that neither the leakage of the liquid nor the entering of the liquid occurs. The power supply state diagnosis unit 52 may measure a time required for the electrostatic capacitance sensor 13 to be completely discharged from a fully charged state. When the time is longer than the threshold, the power supply state diagnosis unit 52 may determine that any one of the leakage of the liquid and the entering of the liquid occurs.

Figure 8:
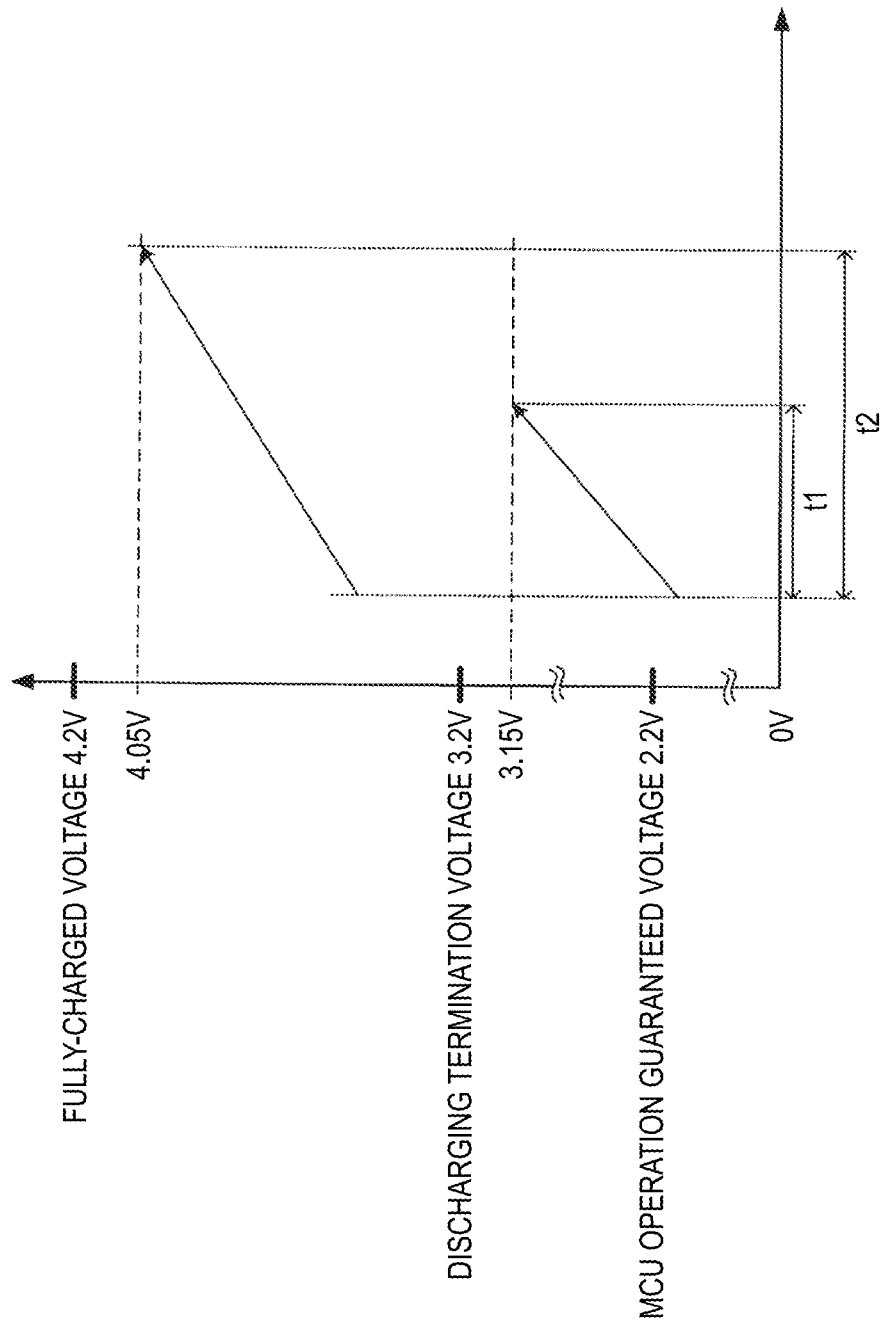
FIG. 8 is a schematic diagram for illustrating diagnosis processes from a second diagnosis process to a fifth diagnosis process.

FIG. 8 is a schematic diagram for illustrating diagnosis processes from the second diagnosis process to the fifth diagnosis process. In the example of FIG. 8, as for the power supply voltage of the power supply 12, 4.2 V is a fully-charged voltage, and 3.2 V is a discharging termination voltage. Further, an operation guaranteed voltage of the MCU 50 is 2.2 V.

(Second Diagnosis Process)

The second diagnosis process is a process of diagnosing whether the power supply 12 is in the failure state based on a change in a power supply voltage during charging of the power supply 12. Specifically, when a decrease in the power supply voltage equal to or higher than a threshold TH1 occurs during the charging of the power supply 12, the power supply state diagnosis unit 52 determines that an internal short circuit has occurred in the power supply 12, and diagnoses that the power supply 12 is in the failure state. The power supply voltage of the power supply 12 during charging continues to increase until the fully-charged voltage is reached. However, when the internal short circuit of the power supply 12 occurs, a potential difference between a positive electrode and a negative electrode is reduced or lost. Therefore, the power supply voltage of the power supply 12 also decreases during the charging. In the second diagnosis process, this principle is used to diagnose whether the power supply 12 is in the failure state due to the internal short circuit. Further, the threshold TH1 is preferably selected in a range of 0.1 V to 1.0 V.

(Third Diagnosis Process)

The third diagnosis process is a process of estimating a charging capacity of the power supply 12 based on a charging speed of the power supply 12, and diagnosing whether the power supply 12 is in the deterioration state based on the charging capacity. The power supply state diagnosis unit 52 executes the third diagnosis process when the power supply voltage of the power supply 12 is equal to or higher than the discharging termination voltage. Specifically, the power supply state diagnosis unit 52 measures a charging time t2 required for the power supply voltage to reach a reference voltage (for example, 4.05 V). When the charging time t2 is less than a predetermined threshold TH2, the power supply state diagnosis unit 52 determines that the charging capacity is small and diagnoses that the power supply 12 is in the deterioration state. The threshold TH2 is set in accordance with a difference between a power supply voltage at the start of charging and the reference voltage.

The charging capacity of the power supply 12 gradually decreases in accordance with progress of the deterioration. The third diagnosis process is a process of diagnosing whether the power supply 12 is in the deterioration state by using this principle. Instead of the time required for the power supply 12 to be charged from a certain voltage to the reference voltage, whether the power supply 12 is in the deterioration state may be diagnosed based on how much the power supply voltage of the power supply 12 is changed within a reference time.

(Fourth Diagnosis Process)

The fourth diagnosis process is a process of diagnosing whether the power supply 12 is in the deterioration state based on an accumulated charging time. Specifically, when an integrated value of a charging time of the power supply 12 is larger than a threshold TH3, the power supply state diagnosis unit 52 determines that the power supply 12 has reached an end of lifetime and diagnoses that the power supply 12 is in the deterioration state. When charging and discharging are repeated, the power supply 12 irreversibly deteriorates.

Deterioration of the power supply 12 is likely to progress particularly during charging. The fourth diagnosis process is a process of diagnosing whether the power supply 12 is in the deterioration state by using this principle.

(Fifth Diagnosis Process)

The fifth diagnosis process is a process of diagnosing whether the power supply 12 is in the deterioration state based on a degree of increase in the power supply voltage during charging. The power supply state diagnosis unit 52 executes the fifth diagnosis process in a state where the power supply voltage is in the vicinity of the operation guaranteed voltage of the MCU 50. In the fifth diagnosis process, the power supply state diagnosis unit 52 performs charging for a predetermined time t1. During the time t1, when the power supply voltage does not reach 3.15 V, the power supply state diagnosis unit 52 determines that the power supply 12 is under an influence of over-discharge or deep-discharge and diagnoses that the power supply 12 is in the deterioration state or the failure state.

(Sixth Diagnosis Process)

The sixth diagnosis process is a process of diagnosing whether the power supply 12 is in the deterioration state based on internal resistance of the power supply 12. As the power supply 12 deteriorates, the internal resistance of the power supply 12 increases. In the sixth diagnosis process, whether the power supply 12 is in the deterioration state is diagnosed by monitoring a change in the internal resistance.

For example, during a period from when a puff operation is detected to when generation of the aerosol in accordance with the puff operation is started, the power supply state diagnosis unit 52 sequentially obtains an open circuit voltage (OCV) of the power supply 12 and a closed circuit voltage (CCV) of the power supply 12 from the voltage sensor 16, and calculates the internal resistance of the power supply 12 based on the obtained open circuit voltage (OCV) and the closed circuit voltage (CCV). When the calculated internal resistance is larger than a predetermined resistance threshold, the power supply state diagnosis unit 52 diagnoses that the power supply 12 is in the deterioration state. When the internal resistance is equal to or smaller than the resistance threshold, the power supply state diagnosis unit 52 diagnoses that the power supply 12 is not in the deterioration state. The resistance threshold may be set based on internal resistance of the new power supply 12.

Figure 9:
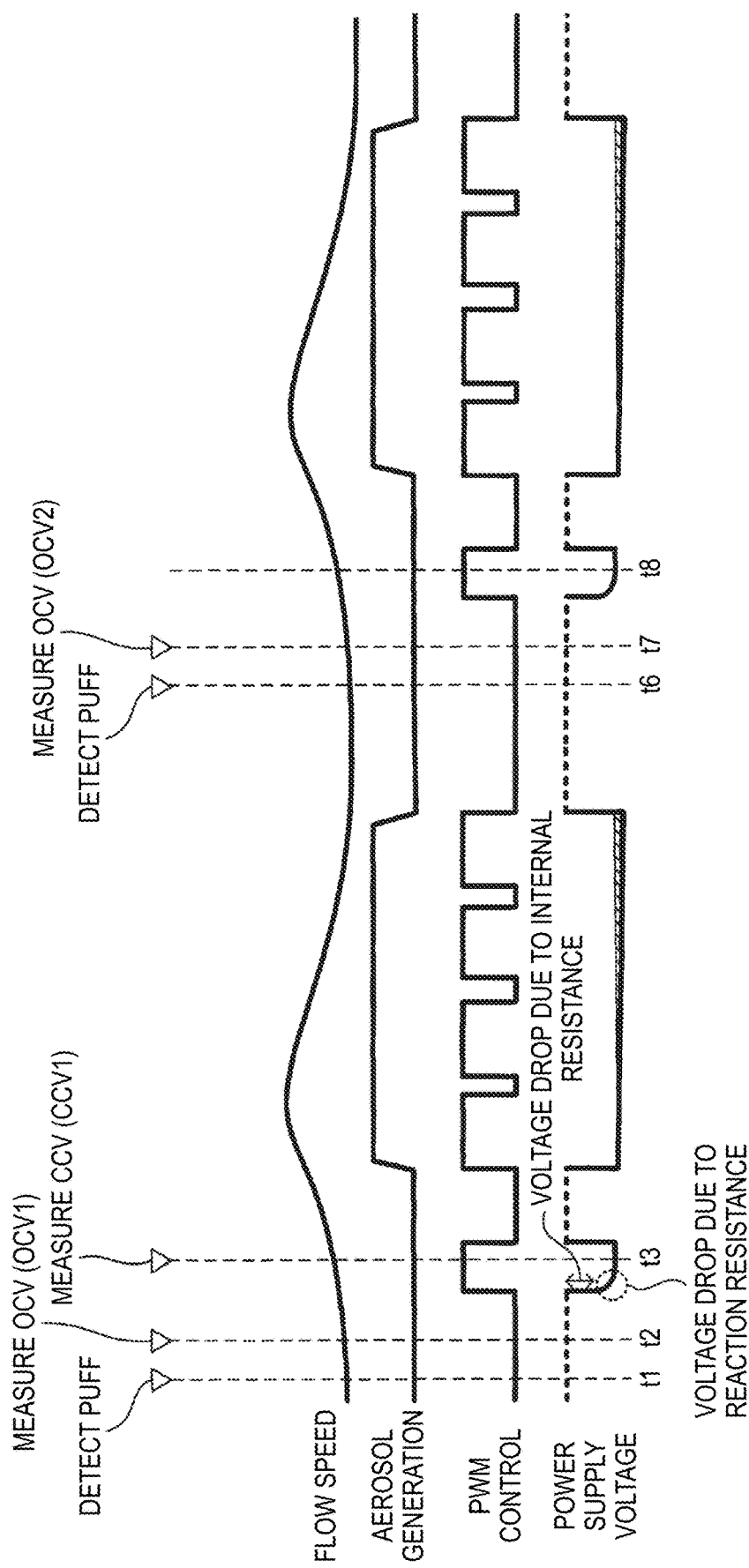
FIG. 9 is a timing chart when an aerosol suction device 1 generates an aerosol in accordance with puff operations.

FIG. 9 is a timing chart when the aerosol suction device 1 generates the aerosol in accordance with puff operations.

First, at a time point t1, the aerosol generation request detector 51 detects an aerosol generation request based on an output result of the intake sensor 15. At a time point t2 after the time point t1, the power supply state diagnosis unit 52 obtains an open circuit voltage OCV1 of the power supply 12 measured by the voltage sensor 16.

After obtaining the open circuit voltage OCV1 at the time point t2, the power supply state diagnosis unit 52 performs control to close the switch 19 for diagnosis of the power supply 12. The time for closing the switch 19 here is so short that generation of the aerosol is not performed. That is, during a period in which the switch 19 is closed, an amount of power smaller than an amount of power supplied to the load 21 to generate the aerosol is supplied to the load 21. Instead of the present embodiment, the power supply state diagnosis unit 52 may obtain a closed circuit voltage CCV1 before obtaining the open circuit voltage OCV1.

As shown in FIG. 9, immediately after the switch 19 is closed, the power supply voltage of the power supply 12 instantaneously decreases due to the internal resistance between the electrodes of the power supply 12 (resistance between the electrodes when lithium ions move between the electrodes). Thereafter, the power supply voltage of the power supply 12 gradually decreases and is stabilized due to reaction resistance (resistance when lithium ions move at an interface between the electrode and the electrolytic solution) of the power supply 12.

At a time point t3 when the drop of the power supply voltage due to the reaction resistance ends, the power supply state diagnosis unit 52 obtains the closed circuit voltage CCV1 of the power supply 12 measured by the voltage sensor 16. When the closed circuit voltage CCV1 is obtained, the power supply state diagnosis unit 52 performs control to open the switch 19. Thereafter, the power controller 53 starts the PWM control of the switch 19 so as to generate the aerosol.

The power supply state diagnosis unit 52 calculates the internal resistance of the power supply 12 (sum of the internal resistance between the electrodes and the reaction resistance) by dividing a value, which is obtained by subtracting the closed circuit voltage CCV1 obtained at the time point t3 from the open circuit voltage OCV1 obtained at the time point t2, by a value of a current that flows to the load 21 while the switch 19 is closed for the diagnosis of the power supply 12 after the time point t2. When the value of the current that flows through the load 21 while the switch 19 is closed for the diagnosis of the power supply 12 is known, the internal resistance of the power supply 12 may be calculated by dividing the value obtained by subtracting the closed circuit voltage CCV1 from the open circuit voltage OCV1 by the known value.

When the calculated internal resistance is larger than the resistance threshold, the power supply state diagnosis unit 52 diagnoses that the power supply 12 deteriorates, and when the internal resistance is equal to or smaller than the resistance threshold, the power supply state diagnosis unit 52 diagnoses that the power supply 12 is not in the deterioration state.

(Seventh Diagnosis Process)

The seventh diagnosis process is a process of diagnosing whether the power supply 12 is in the failure state based on a change in the power supply voltage of the power supply 12 before and after generation of the aerosol. A failure of the power supply 12 mentioned here includes at least one of an internal short circuit due to contact between the positive electrode and the negative electrode inside the power supply and an external short circuit in which the positive electrode and the negative electrode are in contact with each other via a low-resistance conductor outside the power supply.

When the internal short circuit or the external short circuit occurs, a voltage drop amount, which is a value obtained by subtracting a power supply voltage of the power supply 12 after generation of the aerosol from a power supply voltage of the power supply 12 before the generation of the aerosol, becomes larger than a value corresponding to a discharging amount used for the generation of the aerosol. This is because, when the internal short circuit and the external short circuit occur, the potential difference between the positive electrode and the negative electrode is reduced or lost, and thus the power supply voltage of the power supply 12 is greatly decreased. In the seventh diagnosis process, whether the power supply 12 is in the failure state is diagnosed by monitoring the voltage drop amount.

Specifically, the power supply state diagnosis unit 52 obtains the open circuit voltage OCV1 of the power supply 12 measured by the voltage sensor 16 at the time point t2, which is a timing before the generation of the aerosol in the timing chart shown in FIG. 9. After the time point t2, the power controller 53 starts the PWM control, the PWM control ends, and the generation of the aerosol ends. At a subsequent time point t6, when the aerosol generation request is detected again based on an output result of the intake sensor 15, at a time point t7 after the time point t6, the power supply state diagnosis unit 52 obtains an open circuit voltage OCV2 of the power supply 12 measured by the voltage sensor 16. The power supply state diagnosis unit 52 may obtain the open circuit voltage OCV2 of the power supply 12 before the re-detection of the aerosol generation request at the time point t6.

When the voltage drop amount, which is due to the generation of the aerosol and is obtained by subtracting the open circuit voltage OCV2 from the open circuit voltage OCV1, is larger than the drop threshold, the power supply state diagnosis unit 52 diagnoses that the power supply 12 has failed. When the voltage drop amount is equal to or smaller than the drop threshold, the power supply state diagnosis unit 52 diagnoses that the power supply 12 has not failed. The drop threshold is set, for example, to a value larger than a value corresponding to a maximum amount of power required for making one second cartridge 30 empty (used).

At the time point t3 that is a timing before the generation of the aerosol in the timing chart shown in FIG. 9, the power supply state diagnosis unit 52 may obtain the closed circuit voltage CCV1 of the power supply 12 measured by the voltage sensor 16. At a time point t8 during a period in which the switch 19 is temporarily closed after the time point t6, the power supply state diagnosis unit 52 may obtain a closed circuit voltage CCV2 of the power supply 12 measured by the voltage sensor 16. The power supply state diagnosis unit 52 may diagnose whether the power supply 12 is in the failure state by determining whether a value obtained by subtracting the closed circuit voltage CCV2 from the closed circuit voltage CCV1 is larger than the drop threshold.

When the internal short circuit occurs in the power supply 12, the voltage drop amount due to the generation of the aerosol is larger than that when the external short circuit occurs in the power supply 12. Therefore, the drop threshold is set in two stages of a first drop threshold and a second drop threshold larger than the first drop threshold, so that whether the internal short circuit or the external short circuit has occurred can be determined.

For example, when a voltage drop amount obtained by subtracting the open circuit voltage OCV1 from the open circuit voltage OCV2 is larger than the second drop threshold, the power supply state diagnosis unit 52 diagnoses that the power supply 12 is in the failure state due to the internal short circuit. When the voltage drop amount is larger than the first drop threshold and is equal to or smaller than the second drop threshold, the power supply state diagnosis unit 52 diagnoses that the power supply 12 is in the failure state due to the external short circuit. When the voltage drop amount is equal to or smaller than the first drop threshold, the power supply state diagnosis unit 52 diagnoses that the power supply 12 is not in the failure state. Even when a closed circuit voltage is used instead of an open circuit voltage, the power supply state diagnosis unit 52 may determine whether the internal short circuit or the external short circuit has occurred by providing a plurality of drop thresholds in the same manner.

(Eighth Diagnosis Process)

The eighth diagnosis process is a process of diagnosing whether the power supply 12 is in the deterioration state based on a change in discharging characteristics of the power supply 12.

Figure 10:
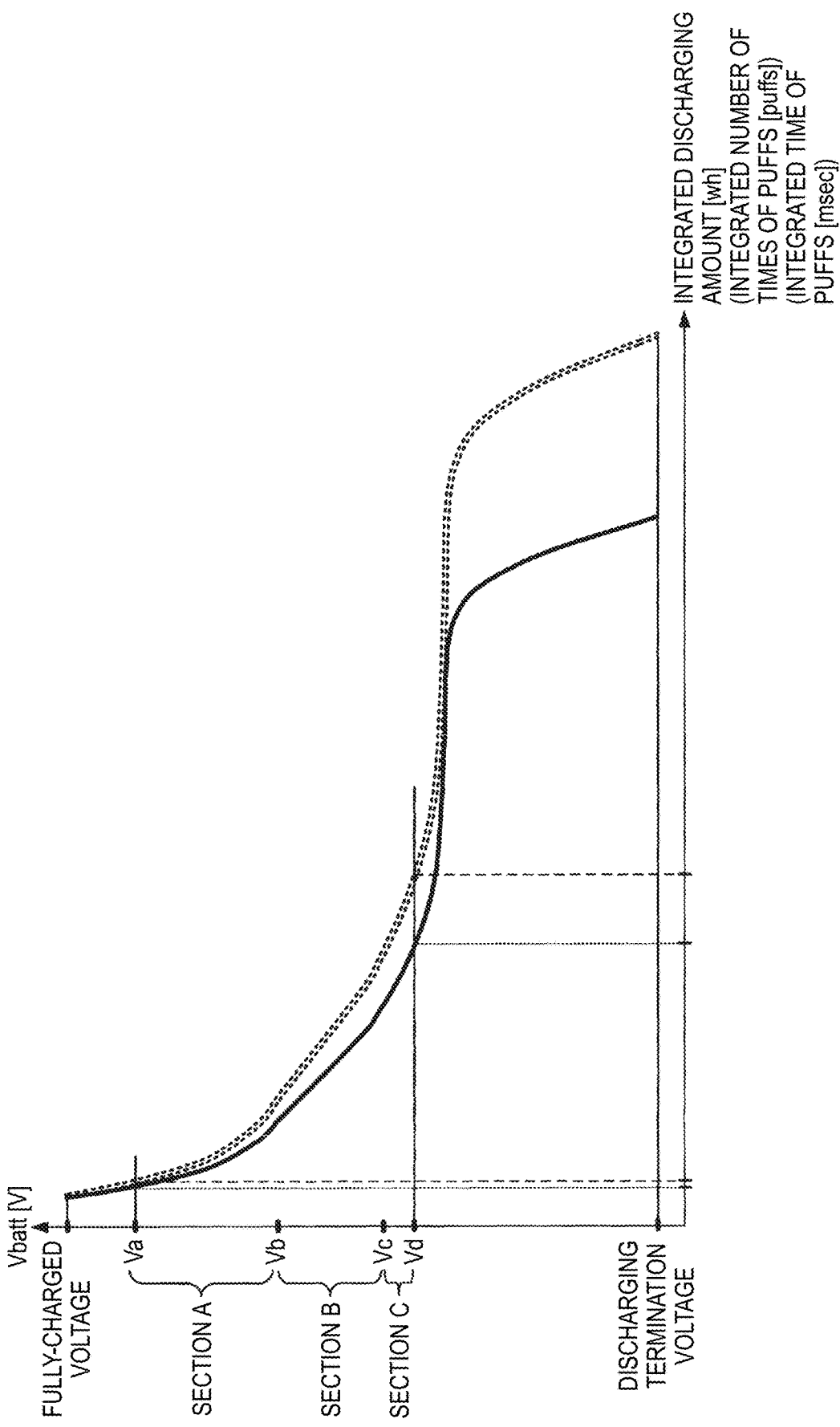
FIG. 10 is a diagram showing an example of discharging characteristics of a new power supply 12 and the deteriorated power supply 12.

FIG. 10 is a diagram showing an example of discharging characteristics of the new power supply 12 and the deteriorated power supply 12. A vertical axis of FIG. 10 indicates the power supply voltage $V_{Batt}$ (open circuit voltage OCV or closed circuit voltage CCV) of the power supply 12. A horizontal axis of FIG. 10 indicates an integrated value of a discharging amount of the power supply 12. A waveform of a broken line shown in FIG. 10 indicates the discharging characteristics of the new power supply 12. A waveform of a solid line shown in FIG. 10 indicates the discharging characteristics of the deteriorated power supply 12.

As shown in FIG. 10, as the power supply 12 deteriorates, an integrated discharging amount decreases even with the same power supply voltage $V_{Batt}$. A region in which a large difference occurs in the integrated discharging amount is a region slightly before a so-called plateau region in which a drop amount of the power supply voltage per unit discharging amount is gentle. In the eighth diagnosis process, the power supply state diagnosis unit 52 monitors a relationship between the integrated discharging amount and the power supply voltage of the power supply 12 in a region slightly before a plateau region of the new power supply 12.

Specifically, the power supply state diagnosis unit 52 sets a voltage at the time of the integrated discharging amount slightly before reaching the plateau region of the discharging characteristics of the new power supply 12 as a threshold voltage Vd, and further sets a threshold voltage Va higher than the threshold voltage Vd and lower than the fully-charged voltage.

The power supply state diagnosis unit 52 determines whether an integrated discharging amount of the power supply 12, which is during a period from when the power supply voltage $V_{Batt}$ measured by the voltage sensor 16 becomes the threshold voltage Va until a value of the power supply voltage $V_{Batt}$ measured by the voltage sensor 16 reaches the threshold voltage Vb, is larger than a predetermined threshold X1. When the integrated discharging amount is larger than the threshold X1, the power supply state diagnosis unit 52 diagnoses that the power supply 12 is in a state of maintaining performance to an extent that replacement is unnecessary (in other words, not the deterioration state where deterioration has progressed to a predetermined state). When the integrated discharging amount is equal to or smaller than the threshold X1, the power supply state diagnosis unit 52 diagnoses that the power supply 12 is in a state where deterioration has progressed to an extent that the replacement is necessary (in other words, the deterioration state where the deterioration has progressed to the predetermined state).

A period during which the power supply voltage $V_{Batt}$ reaches the threshold voltage Vb from the threshold voltage Va may be divided into three sections, that is, a section A, a section B, and a section C as shown in FIG. 10. A threshold X2 may be set in the section A, a threshold X3 may be set in the section B, and a threshold X4 may be set in the section C. For each section, the integrated discharging amount or the like may be compared with a threshold so as to determine whether the power supply 12 is in the deterioration state. In this case, a total value of the threshold X2, the threshold X3, and the threshold X4 is preferably larger than the threshold X1.

Instead of the integrated discharging amount of the power supply 12 during the period during which the power supply voltage $V_{Batt}$ reaches the threshold voltage Vb from the threshold voltage Va, the power supply state diagnosis unit 52 may use an integrated number of times of puff operations detected during the period, an integrated time of the puff operations detected during the period, an integrated energization time during which the load 21 is energized during the period, and the like. When power or an amount of power supplied to the load 21 is controlled so as to fall within a certain range by the above-described PWM control or PFM control, a state of the power supply 12 can be diagnosed only with such an easily detectable parameter.

In the aerosol suction device 1, when a result of any one of the above-described eight types of diagnosis processes is the "deterioration state" or the "failure state", the notification controller 54 causes the notification unit 45 to notify that the power supply 12 has deteriorated, the power supply 12 has failed, the power supply 12 needs to be replaced, or the like. Further, when a result of any one of the above-described eight types of diagnosis processes is the "deterioration state" or the "failure state", the MCU 50 performs control so as not to generate the aerosol thereafter. Accordingly, the aerosol suction device 1 can be prevented from being used in a state where the power supply 12 has deteriorated or failed, and safety of the product can be improved.

(Effects of Aerosol Suction Device of Embodiment)

According to the aerosol suction device 1, the state of the power supply 12 can be multifacetedly diagnosed by the eight types of diagnosis processes. Therefore, it is unlikely to overlook an event such as the deterioration or the failure of the power supply 12 overlooked in one diagnosis process. Therefore, diagnostic accuracy of the state of the power supply 12 can be improved, and the safety of the product can be improved.

The power supply state diagnosis unit 52 executes the first diagnosis process in the free mode other than the charging mode. The power supply state diagnosis unit 52 executes the first diagnosis process in the power mode other than the charging mode. In addition to the first diagnosis process, the power supply state diagnosis unit 52 executes the sixth diagnosis process, the seventh diagnosis process, and the eighth diagnosis process in the discharging mode other than the charging mode. Accordingly, according to the aerosol suction device 1, since the diagnosis processes of the power supply can be executed in each of the free mode, the power mode, and the discharging mode other than the charging mode, safety of the power supply can be improved in a plurality of modes other than charging mode. Further, safety during use of the device can be improved.

According to the aerosol suction device 1, the first diagnosis process can be executed in each of the charging mode, the free mode, the power mode, and the discharging mode. Accordingly, since the same diagnosis process can be executed in a plurality of modes, a possibility of detecting an abnormality in the power supply 12 or the like can be improved. Particularly, since the first diagnosis process is a process that does not require discharging of the power supply 12, even when the first diagnosis process is executed in a plurality of modes, a decrease in a remaining capacity of the power supply 12 can be reduced and a usable time of the device can be extended.

Whether any one of or both of leakage of a liquid such as an electrolytic solution inside the power supply unit case 11 and entering of a liquid from outside into the power supply unit case 11 have occurred is determined in the first diagnosis process. The leakage of the liquid such as the electrolytic solution may occur due to an impact such as dropping. The entering of the liquid may occur due to submersion. That is, a failure of the power supply 12 caused by the leakage of the liquid and the entering of the liquid may occur due to handling of the aerosol suction device 1, regardless of a mode of the aerosol suction device 1. Therefore, it is preferable to execute the first diagnosis process in the plurality of modes.

A failure of the power supply 12 due to the leakage of the liquid such as the electrolytic solution or the entering of the liquid may occur regardless of charging/discharging of the power supply 12. Further, the first diagnosis process can be executed with low power consumption. Therefore, the power supply state diagnosis unit 52 can improve the safety of the power supply 12 in the free mode while reducing power consumption of the power supply 12 in the free mode by executing the first diagnosis process also in the free mode.

According to the aerosol suction device 1, different diagnosis processes can be executed in the charging mode, the discharging mode, the free mode, and the power mode. Accordingly, since different diagnosis processes can be executed in a plurality of modes, a diagnosis process suitable for each mode can be executed, and the power supply 12 can be efficiently and accurately diagnosed. Further, a diagnosis process performed in the discharging mode is a process that requires discharging, and a diagnosis process performed in the charging mode is a diagnosis process that does not require the discharging. Accordingly, since a plurality of diagnosis processes that are different in necessity of discharging and correspond to purposes of the modes can be executed, the safety of the power supply 12 can be evaluated from various viewpoints.

According to the aerosol suction device 1, more diagnosis processes are executed in the discharging mode than in the free mode and the power mode. Therefore, the state of the power supply 12 is easily managed in the discharging mode in which deterioration progresses more easily than in the free mode and the power mode of the power supply 12.

According to the aerosol suction device 1, the number of diagnosis processes executed in the charging mode is larger than the number of diagnosis processes executed in the free mode and the power mode. Therefore, a large number of diagnosis processes can be executed in a state where a charging/discharging state of the power supply 12 is stable and a load of the MCU 50 is low.

According to the aerosol suction device 1, no diagnosis process is executed in the sleep mode. Therefore, power consumption in the sleep mode can be reduced.

(First Modification of Aerosol Suction Device)

The power supply state diagnosis unit 52 may execute the first diagnosis process in the sleep mode. Accordingly, since the diagnosis process is performed in the sleep mode that can be executed for a long time, safety of the power supply 12 when a device is not used can be improved. As described above, a failure of the power supply 12 due to the leakage of the liquid such as the electrolytic solution or the entering of the liquid diagnosed in the first diagnosis process may occur regardless of charging/discharging of the power supply 12. Further, the first diagnosis process can be executed with low power consumption. Therefore, the power supply state diagnosis unit 52 can improve the safety of the power supply 12 in the sleep mode while reducing power consumption of the power supply 12 in the sleep mode by executing the first diagnosis process also in the sleep mode.

(Second Modification of Aerosol Suction Device)

The power supply state diagnosis unit 52 may perform the following ninth diagnosis process and tenth diagnosis process in addition to the above-described eight types of diagnosis processes.

(Ninth Diagnosis Process)

A pressure sensor or a strain gauge (displacement sensor) is attached to the power supply 12. The power supply state diagnosis unit 52 diagnoses whether the power supply 12 is in the deterioration state based on an expansion amount of the power supply 12 that is based on an output signal of the pressure sensor or the strain gauge (displacement sensor). As the power supply 12 deteriorates, gas generated by irreversible decomposition of an electrolytic solution and an active material inside the power supply 12 makes the power supply 12 expand as compared with a new one. Therefore, whether the power supply 12 has deteriorated due to the expansion amount can be diagnosed.

(Tenth Diagnosis Process)

A temperature sensor that detects a temperature of the power supply 12 is provided. The power supply state diagnosis unit 52 diagnoses whether the power supply 12 is in the deterioration state based on the temperature of the power supply 12 measured by the temperature sensor. As the power supply 12 deteriorates, Joule heat, caused by irreversibly increased internal resistance, increases a heat generation amount of the power supply 12 during charging and discharging. Therefore, a temperature of the power supply 12 corresponding to the heat generation amount is monitored, so that whether the power supply 12 is in the deterioration state can be diagnosed.

The power supply state diagnosis unit 52 executes, for example, at least one of the ninth diagnosis process and the tenth diagnosis process in modes other than the sleep mode. The power supply state diagnosis unit 52 may execute, for example, at least one of the ninth diagnosis process and the tenth diagnosis process only in the discharging mode in which safety is particularly required. As another example, the power supply state diagnosis unit 52 executes diagnosis processes also in the charging mode. At least one of the ninth diagnosis process and the tenth diagnosis process may be executed.

In the aerosol suction device 1 described above, the power supply state diagnosis unit 52 may not execute all eight types of diagnosis processes from the first diagnosis process to the eighth diagnosis process. For example, in the discharging mode, the power supply state diagnosis unit 52 may execute the first diagnosis process and one or two diagnosis processes selected from three diagnosis processes, that is, from the sixth diagnosis process to the eighth diagnosis process, and in the charging mode, the power supply state diagnosis unit 52 may execute the first diagnosis process and one to four diagnosis processes selected from five diagnosis processes, that is, from the second diagnosis process to the fifth diagnosis process.

In the aerosol suction device 1 described above, the free mode is not essential and may be omitted. In this case, when an operation of the operation unit 14 is performed in the sleep mode, the sleep mode may be shifted to the power mode. Even in this case, the power supply state diagnosis unit 52 can improve safety of the power supply 12 in the sleep mode while reducing power consumption of the power supply 12 in the sleep mode by executing the first diagnosis process in the sleep mode. In this case, since the sleep mode is executed for a longer period of time, the safety of the power supply 12 can be improved.

At least the following matters are described in the present description. Corresponding components in the above embodiment are shown in parentheses. However, the present disclosure is not limited thereto.

(1)

A power supply unit for an aerosol suction device, including:

a power supply (power supply 12) capable of discharging to a load for generating an aerosol from an aerosol generation source; and a controller (MCU 50) capable of controlling charging and discharging of the power supply, wherein the controller is capable of operating in a charging mode for controlling charging of the power supply, a first mode (free mode, power mode) different from the charging mode, and a second mode (discharging mode) different from the charging mode and the first mode, and is capable of executing diagnosis processes of the power supply in each of the first mode and the second mode.

According to (1), since the diagnosis processes of the power supply can be executed in each of the first mode and the second mode other than the charging mode, safety of the power supply can be improved in a plurality of modes other than the charging mode. Further, safety during use of a device can be improved.

(2)

The power supply unit for the aerosol suction device according to (1), in which the diagnosis processes executable in the first mode and the diagnosis processes executable in the second mode include the same first diagnosis process.

According to (2), since the same diagnosis process can be executed in a plurality of modes, a possibility of detecting an abnormality of the power supply and the like can be improved. Further, it is possible to save electric components necessary for executing the diagnosis processes, a storage region of a memory, and an arithmetic capacity of the controller.

(3)

The power supply unit for the aerosol suction device according to (2), in which the first diagnosis process does not require discharging of the power supply during execution.

According to (3), even when the first diagnosis process is executed in a plurality of modes, a decrease in a remaining capacity of the power supply can be reduced, and a usable time of the device can be extended. Further, since the power supply does not deteriorate due to discharging, the deterioration of the power supply can be prevented.

(4)

The power supply unit for the aerosol suction device according to (2), further comprising:

a housing (power supply unit case 11) configured to house the power supply, wherein the first diagnosis process is a process for detecting at least one of leakage of a liquid inside the housing and entering of a liquid into the housing.

According to (4), it is possible to rapidly detect an event that can cause a failure of the power supply that can occur regardless of a mode.

(5)

The power supply unit for the aerosol suction device according to (1), in which the diagnosis processes executable in the first mode and the diagnosis processes executable in the second mode include different diagnosis processes.

According to (5), since different diagnosis processes can be executed in a plurality of modes, a diagnosis process suitable for each mode can be executed, and the power supply can be efficiently and accurately diagnosed. Further, the power supply can be accurately diagnosed as compared with a case where a single diagnosis process is executed.

(6)

The power supply unit for the aerosol suction device according to (5), in which the diagnosis processes executed in the first mode include a diagnosis process (first diagnosis process) that does not require discharging of the power supply during execution, and the diagnosis processes executed in the second mode include a diagnosis process (sixth diagnosis process, seventh diagnosis process, eighth diagnosis process) that requires discharging of the power supply during execution.

According to (6), since the diagnosis process that requires discharging and the diagnosis process that does not require discharging can be executed, safety of the power supply can be evaluated from various viewpoints. Further, since the diagnosis processes include the diagnosis process that does not require discharging, deterioration of the power supply due to the discharging is unlikely to occur, and the deterioration of the power supply can be prevented.

(7)

The power supply unit for the aerosol suction device according to (6), in which the diagnosis process that requires the discharging of the power supply is a process of diagnosing a deterioration state of the power supply based on internal resistance of the power supply.

According to (7), since the deterioration state of the power supply is diagnosed based on the internal resistance, it is not necessary to discharge for a long time, and diagnosis can be performed with high accuracy based on a parameter closely related to the deterioration state of the power supply.

(8)

The power supply unit for the aerosol suction device according to (1), in which the controller is configured to control the power supply such that discharging is performed to the load only in the second mode, and the number of the diagnosis processes executed in the second mode is larger than the number of the diagnosis processes executed in the first mode.

According to (8), since a large number of diagnosis processes are executed in the mode in which the discharging is performed to the load, it becomes easy to manage a state of the power supply in a mode in which deterioration of the power supply and the like easily progress. Further, even when the deterioration progresses, occurrence of the deterioration can be rapidly detected.

(9)

The power supply unit for the aerosol suction device according to (1) or (8), in which the controller is configured to control the power supply such that discharging is performed to the load only in the second mode, and the number of the diagnosis processes executed in the charging mode is larger than the number of the diagnosis processes executed in the second mode.

According to (9), since a large number of diagnosis processes are executed in the charging mode, the large number of diagnosis processes can be executed in a state where a charging/discharging state of the power supply is stable and a load of the controller is low. Further, a state of the power supply is easily managed in the charging mode in which deterioration of the power supply or the like is particularly likely to progress. Further, even when the deterioration progresses, occurrence of the deterioration can be rapidly detected.

(10)

The power supply unit for the aerosol suction device according to any one of (1) to (9), in which the controller is further capable of operating in a sleep mode having power consumption lower than those of the first mode and the second mode, and capable of executing the diagnosis processes of the power supply in the sleep mode.

According to (10), since the diagnosis processes are performed in the sleep mode that can be executed for a long time, safety of the power supply when the device is not used can be improved.

(11)

The power supply unit for the aerosol suction device according to (10), in which comprising:

a housing configured to house the power supply, in which the diagnosis processes executed in the sleep mode is a process for detecting at least one of leakage of a liquid inside the housing and entering of a liquid into the housing.

According to (11), the leakage and the entering of the liquid are detected which are more likely to occur than other deterioration and failures in the sleep mode, so that safety of the power supply in the sleep mode can be evaluated. Further, appropriate diagnosis processes are performed in the sleep mode, so that a reduction in power consumption and evaluation of the safety of the power supply can be implemented together in the sleep mode.

(12)

The power supply unit for the aerosol suction device according to any one of (1) to (9), in which the controller is further capable of operating in a sleep mode having power consumption lower than those of the first mode and the second mode, and incapable of executing the diagnosis processes of the power supply in the sleep mode.

According to (12), the power consumption in the sleep mode can be reduced. Further, progress of deterioration of the power supply in the sleep mode can be prevented.

(13)

A power supply diagnosis method of an aerosol suction device, the aerosol suction device including a power supply capable of discharging to a load for generating an aerosol from an aerosol generation source, and a controller capable of controlling charging and discharging of the power supply, in which the controller is capable of operating in a charging mode for controlling charging of the power supply, a first mode different from the charging mode, and a second mode different from the charging mode and the first mode, and the power supply diagnosis method comprises executing diagnosis processes of the power supply in each of the first mode and the second mode.

(14)

A power supply diagnosis program of an aerosol suction device, the aerosol suction device including a power supply capable of discharging to a load for generating an aerosol from an aerosol generation source, and a controller capable of controlling charging and discharging of the power supply, in which the controller is capable of operating in a charging mode for controlling charging of the power supply, a first mode different from the charging mode, and a second mode different from the charging mode and the first mode, and the power supply diagnosis program causes a computer to perform a step of executing diagnosis processes of the power supply in each of the first mode and the second mode.

The invention claimed is:

1. A power supply unit for an aerosol suction device, comprising:
 a power supply capable of discharging to a load for generating an aerosol from an aerosol generation source; and
 a controller capable of controlling charging and discharging of the power supply, wherein
 the controller is capable of operating in a charging mode for controlling charging of the power supply, a first mode different from the charging mode, and a second mode different from the charging mode and the first mode, and is capable of executing diagnosis processes of the power supply in each of the first mode and the second mode, and
 the diagnosis processes executable in the first mode and the diagnosis processes executable in the second mode include different diagnosis processes,
 wherein the diagnosis processes include at least one of a process for determining whether the power supply is in a deterioration state and a process for determining whether the power supply is in a failure state.

2. The power supply unit for the aerosol suction device according to claim 1, wherein
 the diagnosis processes executed in the first mode include a diagnosis process that does not require discharging of the power supply during execution, and
 the diagnosis processes executed in the second mode include a diagnosis process that requires discharging of the power supply during execution.

3. The power supply unit for the aerosol suction device according to claim 2, wherein
 the diagnosis process that requires the discharging of the power supply is a process of diagnosing a deterioration state of the power supply based on internal resistance of the power supply.

4. The power supply unit for the aerosol suction device according to claim 1, wherein
 the controller is further capable of operating in a sleep mode having power consumption lower than those of the first mode and the second mode, and capable of executing the diagnosis processes of the power supply in the sleep mode.

5. The power supply unit for the aerosol suction device according to claim 4, further comprising:
 a housing configured to house the power supply, wherein
 the diagnosis processes executed in the sleep mode is a process for detecting at least one of leakage of a liquid inside the housing and entering of a liquid into the housing.

6. The power supply unit for the aerosol suction device according to claim 1, wherein
 the controller is further capable of operating in a sleep mode having power consumption lower than those of the first mode and the second mode, and incapable of executing the diagnosis processes of the power supply in the sleep mode.

7. A power supply unit for an aerosol suction device, comprising:
 a power supply capable of discharging to a load for generating an aerosol from an aerosol generation source; and
 a controller capable of controlling charging and discharging of the power supply, wherein
 the controller is capable of operating in a charging mode for controlling charging of the power supply, a first mode different from the charging mode, and a second mode different from the charging mode and the first mode, is configured to control the power supply such that discharging is performed to the load only in the second mode, and is capable of executing diagnosis processes of the power supply in each of the first mode and the second mode, and
 the number of the diagnosis processes executed in the second mode is larger than the number of the diagnosis processes executed in the first mode,
 wherein the diagnosis processes include at least one of a process for determining whether the power supply is in a deterioration state and a process for determining whether the power supply is in a failure state.

8. The power supply unit for the aerosol suction device according to claim 7, wherein
 the controller is configured to control the power supply such that discharging is performed to the load only in the second mode, and
 the number of the diagnosis processes executed in the charging mode is larger than the number of the diagnosis processes executed in the second mode.

9. A power supply diagnosis method of an aerosol suction device, the aerosol suction device including a power supply capable of discharging to a load for generating an aerosol from an aerosol generation source, and a controller capable of controlling charging and discharging of the power supply, wherein
 the controller is capable of operating in a charging mode for controlling charging of the power supply, a first mode different from the charging mode, and a second mode different from the charging mode and the first mode,
 the power supply diagnosis method comprises a step of executing diagnosis processes of the power supply in each of the first mode and the second mode, and
 the diagnosis processes executable in the first mode and the diagnosis processes executable in the second mode include different diagnosis processes,
 wherein the diagnosis processes include at least one of a process for determining whether the power supply is in a deterioration state and a process for determining whether the power supply is in a failure state.

10. A power supply diagnosis method of an aerosol suction device, the aerosol suction device including a power supply capable of discharging to a load for generating an aerosol from an aerosol generation source, and a controller capable of controlling charging and discharging of the power supply, wherein
the controller is capable of operating in a charging mode for controlling charging of the power supply, a first mode different from the charging mode, and a second mode different from the charging mode and the first mode, and is configured to control the power supply such that discharging is performed to the load only in the second mode,
the power supply diagnosis method comprises a step of executing diagnosis processes of the power supply in each of the first mode and the second mode, and
the number of the diagnosis processes executed in the second mode is larger than the number of the diagnosis processes executed in the first mode.

11. A non-transitory computer-readable storage medium of an aerosol suction device storing computer-readable instructions thereon, the aerosol suction device including a power supply capable of discharging to a load for generating an aerosol from an aerosol generation source, and a controller capable of controlling charging and discharging of the power supply, wherein
the controller is capable of operating in a charging mode for controlling charging of the power supply, a first mode different from the charging mode, and a second mode different from the charging mode and the first mode,
wherein executing the computer-readable instructions causes a computer to execute diagnosis processes of the power supply in each of the first mode and the second mode, and
the diagnosis processes executable in the first mode and the diagnosis processes executable in the second mode include different diagnosis processes,
wherein the diagnosis processes include at least one of a process for determining whether the power supply is in a deterioration state and a process for determining whether the power supply is in a failure state.

12. A non-transitory computer-readable storage medium of an aerosol suction device storing computer-readable instructions thereon, the aerosol suction device including a power supply capable of discharging to a load for generating an aerosol from an aerosol generation source, and a controller capable of controlling charging and discharging of the power supply, wherein
the controller is capable of operating in a charging mode for controlling charging of the power supply, a first mode different from the charging mode, and a second mode different from the charging mode and the first mode, and is configured to control the power supply such that discharging is performed to the load only in the second mode,
wherein executing the computer-readable instructions causes a computer to execute diagnosis processes of the power supply in each of the first mode and the second mode, and
the number of the diagnosis processes executed in the second mode is larger than the number of the diagnosis processes executed in the first mode,
wherein the diagnosis processes include at least one of a process for determining whether the power supply is in a deterioration state and a process for determining whether the power supply is in a failure state.

* * * * *